United States Patent
Otremba et al.

(10) Patent No.: US 8,896,106 B2
(45) Date of Patent: Nov. 25, 2014

(54) SEMICONDUCTOR PACKAGES HAVING MULTIPLE LEAD FRAMES AND METHODS OF FORMATION THEREOF

(75) Inventors: Ralf Otremba, Kaufbeuren (DE); Josef Hoeglauer, Kirchhein-Heimstetten (DE); Juergen Schredl, Mering (DE); Xaver Schloegel, Sachsenkam (DE); Klaus Schiess, Allensbach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/544,834

(22) Filed: Jul. 9, 2012

(65) Prior Publication Data

US 2014/0008702 A1 Jan. 9, 2014

(51) Int. Cl.
*H01L 29/76* (2006.01)

(52) U.S. Cl.
USPC ........... 257/666; 257/182; 257/621; 257/661; 257/672; 257/673; 257/676; 257/747; 257/690; 257/E33.066

(58) Field of Classification Search
USPC ......... 257/666, 182, 621, 661, 672, 673, 676, 257/690, 747, E33.066, 213
See application file for complete search history.

(56) References Cited

U.S. PATENT DOCUMENTS

| 6,413,798 | B2 * | 7/2002 | Asada | 438/108 |
|---|---|---|---|---|
| 7,786,558 | B2 | 8/2010 | Otremba | |
| 8,044,523 | B2 | 10/2011 | Otremba | |
| 2004/0145043 | A1 * | 7/2004 | Hayashi et al. | 257/696 |
| 2007/0215980 | A1 | 9/2007 | Otremba | |
| 2007/0284709 | A1 * | 12/2007 | Lange | 257/676 |
| 2008/0017998 | A1 | 1/2008 | Pavio | |
| 2011/0169152 | A1 * | 7/2011 | St. Germain et al. | 257/676 |
| 2013/0056861 | A1 * | 3/2013 | Gao et al. | 257/675 |

FOREIGN PATENT DOCUMENTS

| DE | 102004021054 A1 | 11/2005 |
|---|---|---|
| DE | 102007012986 A1 | 10/2007 |
| DE | 102004030042 B4 | 4/2009 |

* cited by examiner

Primary Examiner — Timor Karimy
(74) Attorney, Agent, or Firm — Slater & Matsil, L.L.P.

(57) ABSTRACT

In accordance with an embodiment of the present invention, a semiconductor package includes a first lead frame having a first die paddle, and a second lead frame, which has a second die paddle and a plurality of leads. The second die paddle is disposed over the first die paddle. A semiconductor chip is disposed over the second die paddle. The semiconductor chip has a plurality of contact regions on a first side facing the second lead frame. The plurality of contact regions is coupled to the plurality of leads.

20 Claims, 16 Drawing Sheets

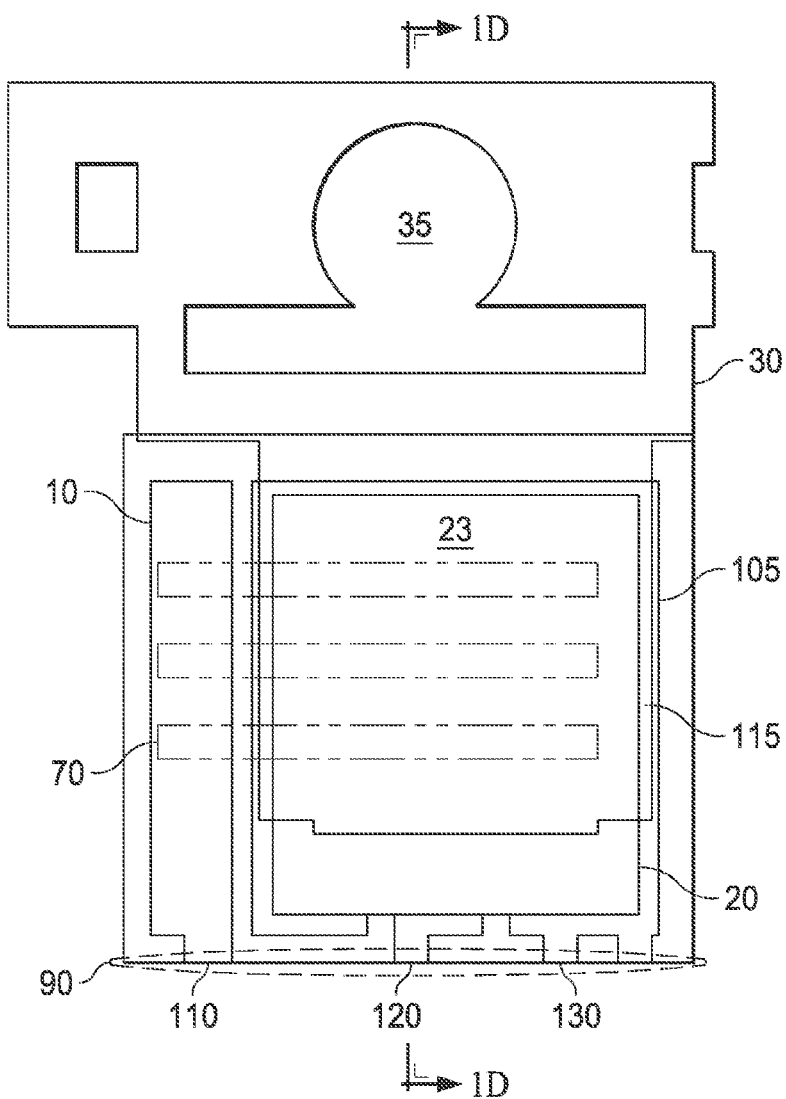
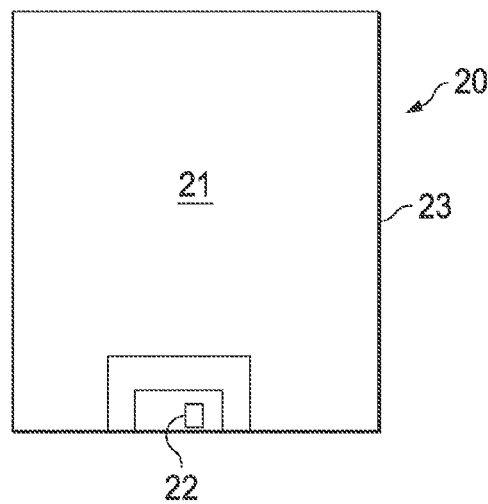

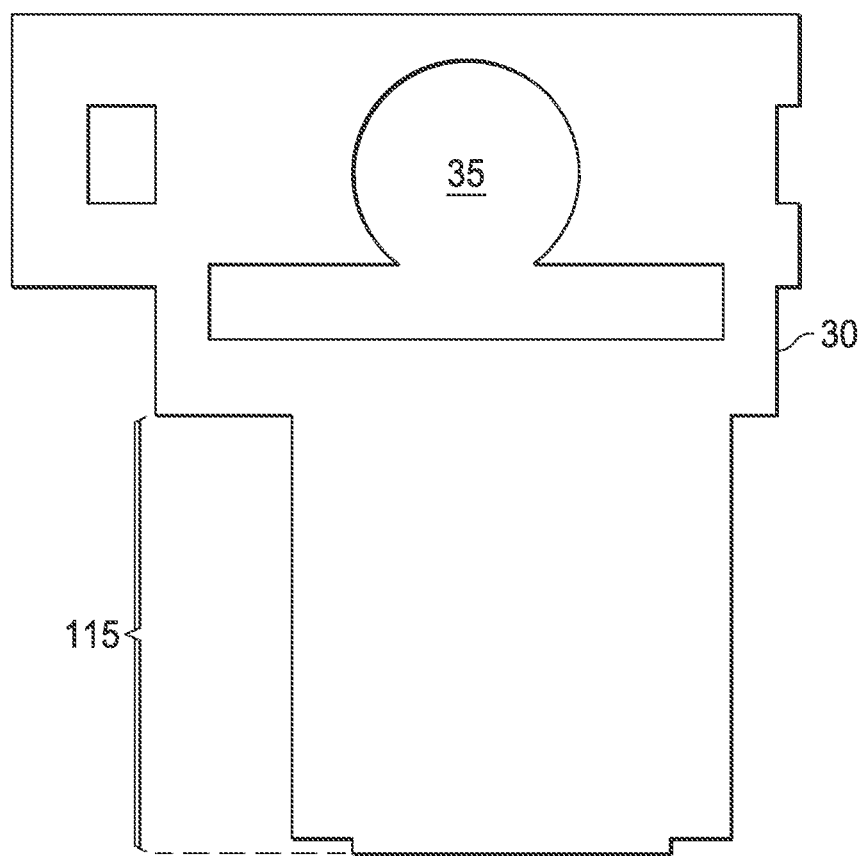

SEMICONDUCTOR PACKAGES HAVING MULTIPLE LEAD FRAMES AND METHODS OF FORMATION THEREOF

TECHNICAL FIELD

The present invention relates generally to semiconductor packages, and more particularly to semiconductor packages having multiple lead frames and methods of formation thereof.

BACKGROUND

Semiconductor devices are used in a variety of electronic and other applications. Semiconductor devices comprise, among other things, integrated circuits or discrete devices that are formed on semiconductor wafers by depositing one or more types of thin films of material over the semiconductor wafers, and patterning the thin films of material to form the integrated circuits.

The semiconductor devices are typically packaged within a ceramic or a plastic body to protect the semiconductor devices from physical damage or corrosion. The packaging also supports the electrical contacts required to connect a semiconductor device, also referred to as a die or a chip, to other devices external to the packaging. Many different types of packaging are available depending on the type of semiconductor device and the intended use of the semiconductor device being packaged. Typical packaging features, such as dimensions of the package, pin count, etc., may comply, among others, with open standards from Joint Electron Devices Engineering Council (JEDEC). Packaging may also be referred as semiconductor device assembly or simply assembly.

One of the concerns of packaging relates to the minimization of parasitic effects. This is because packaging can dramatically alter the performance of the semiconductor chip within because of parasitic resistances, inductances, and others.

SUMMARY OF THE INVENTION

In accordance with an embodiment of the present invention, a semiconductor package comprises a first lead frame, and a second lead frame disposed over the first lead frame. The second lead frame has a die paddle and a plurality of leads. A semiconductor chip is disposed over the second lead frame, the semiconductor chip coupled to the plurality of leads.

In accordance with an alternative embodiment of the present invention, a semiconductor package comprises a first lead frame having a first die paddle, and a second lead frame, which has a second die paddle and a plurality of leads. The second die paddle is disposed over the first die paddle. A semiconductor chip is disposed over the second die paddle. The semiconductor chip has a plurality of contact regions on a first side facing the second lead frame. The plurality of contact regions is coupled to the plurality of leads.

In accordance with yet another embodiment of the present invention, a method of forming a semiconductor package comprises providing a first lead frame having a first die paddle and providing a second lead frame having a second die paddle and a plurality of leads. The second die paddle is attached to the first die paddle. A semiconductor chip is attached to the second die paddle. The semiconductor chip has a plurality of contact regions on a first side facing the second lead frame. The plurality of contact regions is coupled to the plurality of leads.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1A-1D, illustrates a semiconductor package including multiple lead frames in accordance with an embodiment of the present invention, wherein FIG. 1A illustrates a top view, FIG. 1B illustrates a top view of the components within the semiconductor package but without the encapsulant, wherein FIG. 1C illustrates a partial top view, and wherein FIG. 1D illustrates a cross-sectional view;

FIG. 2, which includes

FIG. 3, which includes

FIG. 4 illustrates a second lead frame having an aperture in accordance with an embodiment of the present invention;

FIG. 5, which includes

FIG. 7, which includes FIG. 7A-7B, illustrates the semiconductor package being fabricated after placing the semiconductor chip over the lead frames in accordance with an embodiment of the present invention, wherein FIG. 7A illustrates a top view, and wherein FIG. 7B illustrates a cross-sectional view;

FIG. 8, which includes FIG. 8A-8D, illustrates the semiconductor package being fabricated after forming interconnects over the semiconductor chip in accordance with an embodiment of the present invention, wherein FIGS. 8A and 8B illustrate top views in alternative embodiments, and wherein FIGS. 8C and 8D illustrate cross-sectional views in alternative embodiments;

FIG. 9, which includes FIGS. 9A-9B, illustrates a semiconductor package being fabricated after encapsulation in accordance with an embodiment of the present invention, wherein FIG. 9A illustrates a top view, and wherein FIG. 9B illustrates a cross-sectional view.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of contexts.

The embodiments discussed are merely illustrative of a few ways to make and use the invention, and do not limit the scope of the invention.

Power semiconductor devices draw large amounts of currents and are therefore very susceptible to parasitic losses arising from the package design. Parasitic components may be introduced either at the input side (source side) or at the output side (drain side). These parasitic components may arise from the electrical connections coupling the semiconductor chip to the package leads, which are used to contact the package with external circuitry. The inventors have discovered that the impact of parasitic components introduced by the packaging on the device performance is asymmetric. In particular, parasitic elements on the input side are much more deleterious to the performance of the semiconductor package than parasitic elements on the output side. Accordingly embodiments of the invention provide different package designs that advantageously reduce the parasitic effects on the input side of the semiconductor package.

A structural embodiment of the semiconductor package will be described using FIG. 1. Alternative structural embodiments of the invention will be described using FIGS. 2-5. The method of fabricating the semiconductor package will be described using FIGS. 6-10.

Figure 1A:
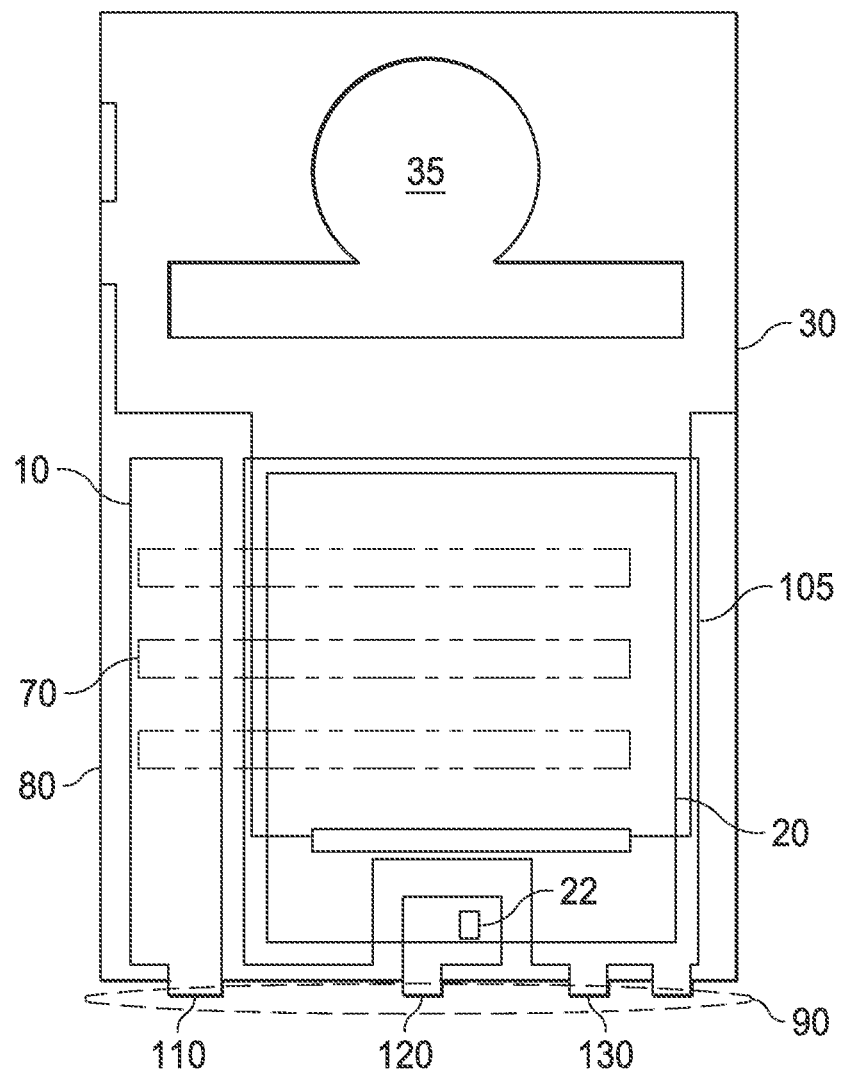
Figure 1D:
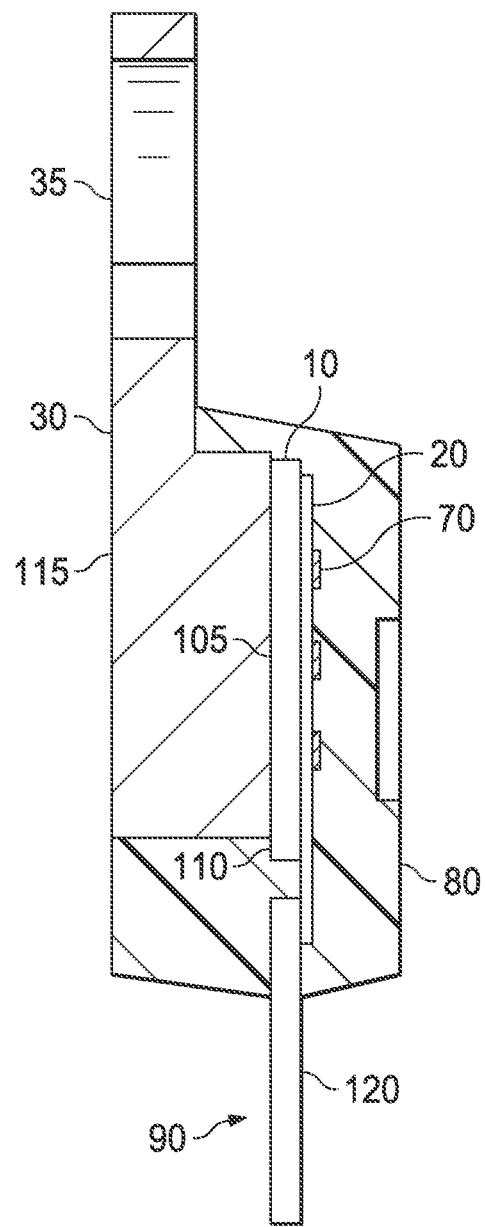

FIG. 1, which includes FIGS. 1A-1D, illustrates a semiconductor package including multiple lead frames in accordance with an embodiment of the present invention, wherein FIG. 1A illustrates a top view, FIG. 1B illustrates a top view of the components within the semiconductor package without the encapsulant, wherein FIG. 1C illustrates a partial top view, and wherein FIG. 1D illustrates a cross-sectional view.

Referring to FIGS. 1A and 1B, the semiconductor package includes a first lead frame 10 over which the semiconductor chip 20 is disposed. The first lead frame 10 has a plurality of leads 90 which includes a first lead 110, a second lead 120, and a third lead 130. The semiconductor chip 20 is coupled to the first lead frame 10. The first lead frame 10 also includes a die paddle 105 (better illustrated in FIG. 1D) over which the semiconductor chip 20 is disposed. The die paddle 105 and the second lead 120 (e.g., gate lead) mechanically support the semiconductor chip 20. In the illustrated embodiment, the die paddle 105 is symmetric such that the second lead 120 (e.g., gate lead) is centrally located. However, in alternative embodiments, the second lead 120 may be located towards one edge of the semiconductor chip 20.

The first lead frame 10 is disposed over a second lead frame 30. The second lead frame 30 may efficiently remove heat from the semiconductor chip 20. In various embodiments, the second lead frame 30 is thicker than the first lead frame 10. In one or more embodiments, the second lead frame 30 is at least two times the thickness of the first lead frame 10. In one embodiment, the second lead frame 30 has a thickness of about 2.4 mm while the first lead frame 10 has a thickness less than 1 mm, while the thickness of the package may be about 4.4 mm. Such dimensions may be in compliance with a packaging standard in one embodiment. However, in alternative embodiments, an additional heat sink may be attached to the semiconductor package using the hole or aperture 35 in the second lead frame 30, which extends through the package.

In various embodiments, the semiconductor chip 20 may comprise different type of dies including integrated circuits or discrete devices. In one or more embodiments, the semiconductor chip 20 may comprise a logic chip, a memory chip, an analog chip, a mixed signal chip, and combinations thereof such as a system on chip. The semiconductor chip 20 may comprise various types of active and passive devices such as diodes, transistors, thyristors, capacitors, inductors, resistors, optoelectronic devices, sensors, microelectromechanical systems, and others.

In various embodiments, the semiconductor chip 20 may be formed on a silicon substrate. Alternatively, in other embodiments, the semiconductor chip 20 may have been formed on silicon carbide (SiC). In one embodiment, the semiconductor chip 20 may have been formed at least partially on gallium nitride (GaN).

In various embodiments, the semiconductor chip 20 may comprise a power semiconductor device, which may be a discrete device in one embodiment. In one embodiment, the semiconductor chip 20 may be a two terminal device such as a PIN diode or a Schottky diode. In one or more embodiments, the semiconductor chip 20 may be a three terminal device such as a power metal insulator semiconductor field effect transistor (MISFET), a junction field effect transistor (JFET), bipolar junction transistor (BJT), an insulated gate bipolar transistor (IGBT), or a thyristor.

In one embodiment, the semiconductor chip 20 comprises a vertical semiconductor device having contact regions on the top side and on an opposite bottom side. As illustrated, one side of the semiconductor chip 20 is coupled to the first lead frame 10 through a plurality of interconnects 70. The plurality of interconnects 70 may comprise strips, clips, wire bonds, and other suitable conductors in various embodiments. For example, in one embodiment, the plurality of interconnects 70 may be a plate. An opposite side of the semiconductor chip 20 is also directly coupled to the first lead frame 10. Accordingly, in FIGS. 1A and 1B, in one embodiment, the first lead 110 is a drain contact, the second lead 120 is a gate contact, and the third lead 130 is the source contact.

As illustrated in FIG. 1C, the bottom side of the semiconductor chip 20 facing the first lead frame 10 comprises a first contact region 21 and the second contact region 22. In one embodiment, the first contact region 21 comprises a source region of the semiconductor device while the second contact region 22 comprises a control region of the semiconductor device.

As further illustrated in FIGS. 1A and 1D, the first lead frame 10, the second lead frame 30, and the semiconductor chip 20 are disposed within an encapsulant 80.

FIG. 1D illustrates a cross-sectional view of the semiconductor package in accordance with an embodiment of the present invention. As described previously, the first lead frame 10 is disposed over the second lead frame 30. The semiconductor chip 20 is disposed over the first lead frame 10. As illustrated in FIG. 1D, the semiconductor chip 20 is disposed on a die paddle 105 of the first lead frame 10 while the die paddle 105 of the first lead frame 10 is disposed over a die attach 115 of the second lead frame 30. The first contact region 21 is disposed directly over the die paddle 105, and maybe coupled through an adhesive layer, for example, a conductive paste or solder layer. The die paddle 105 is electrically insulated from the second lead 120 by the encapsulant 80. The second lead 120 is coupled to the second contact region 22 through an adhesive layer, for example, a solder layer. The third contact region 23 of the semiconductor chip 20 is coupled to the first lead 110 through the plurality of interconnects 70 as also illustrated in FIGS. 1A and 1B.

Advantageously, the first lead frame 10 provides a lower inductance path to connect the first contact region 21 (e.g. source region) with the plurality of leads 90. In contrast, in conventional packages, the source region is wire bonded to the leads of the lead frame thereby having a higher inductance. Further, the second lead frame 30 advantageously removes heat away from the first lead frame 10 and the semiconductor chip 20.

In one or more embodiments, the semiconductor package is a through hole package such as a transistor outline package such as TO220. In alternative embodiments, the semiconductor package is a surface mount package such as a transistor outline package such as TO263.

Figure 2A:
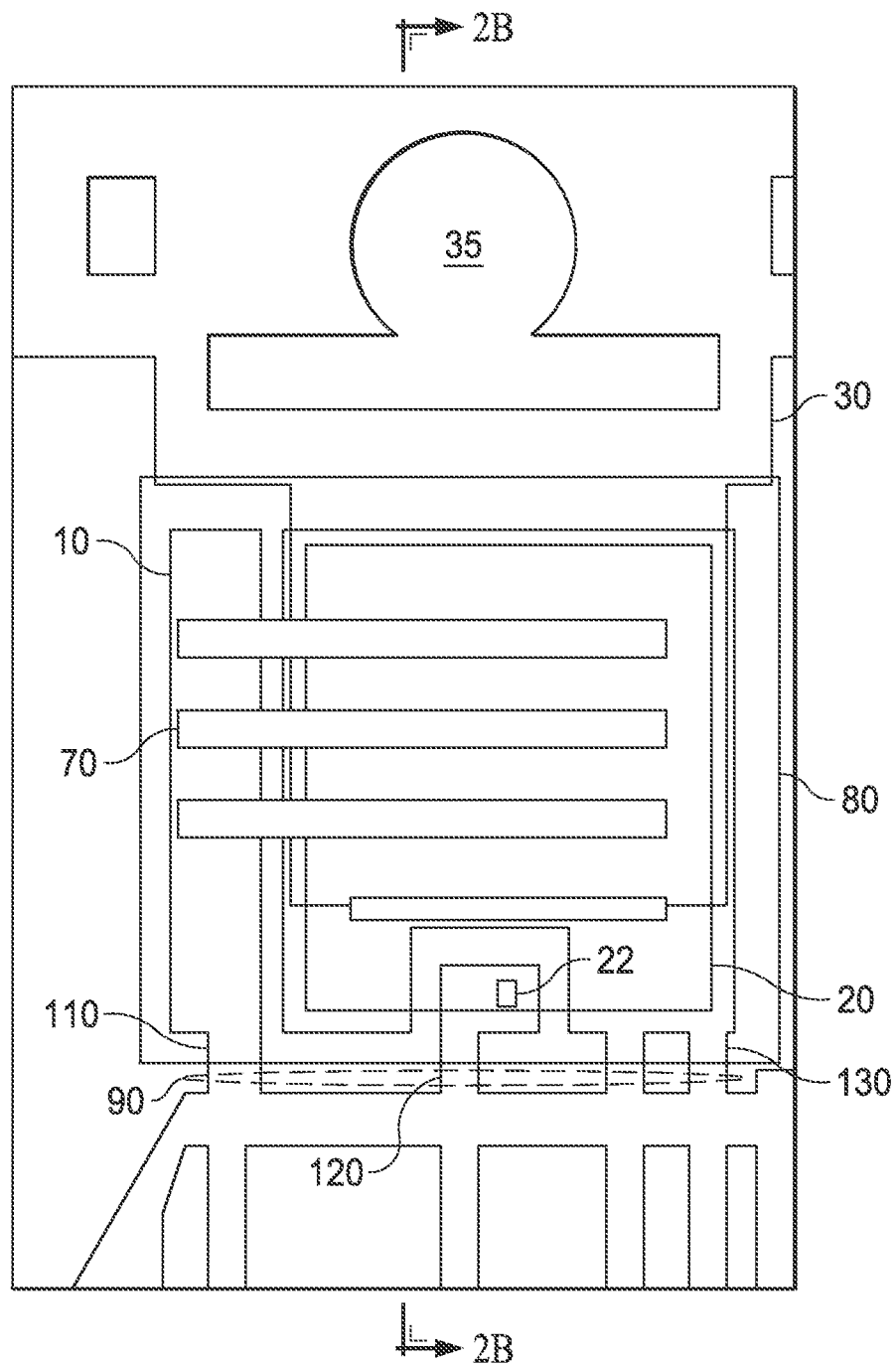
FIGS. 2A-2B, illustrates a semiconductor package in accordance with an alternative embodiment.
Figure 2B:
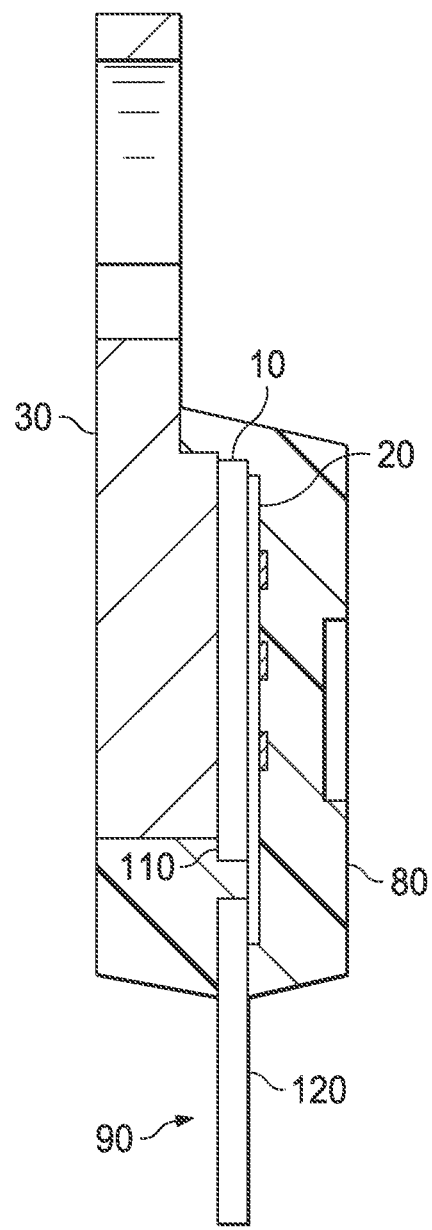

FIG. 2, which includes FIGS. 2A-2B, illustrates a semiconductor package in accordance with an alternative embodiment.

In various embodiments, the semiconductor package dimensions may be modified by changing the thickness of the second lead frame 30. In one embodiment, the second lead frame 30 may have a thickness of about 1.9 mm while the first lead frame 10 has a thickness less than 1 mm, while the thickness of the package may be about 3.9 mm. Accordingly, in this illustration, the semiconductor package is thinner than one embodiment of the semiconductor package illustrated in FIG. 1.

Figure 3A:
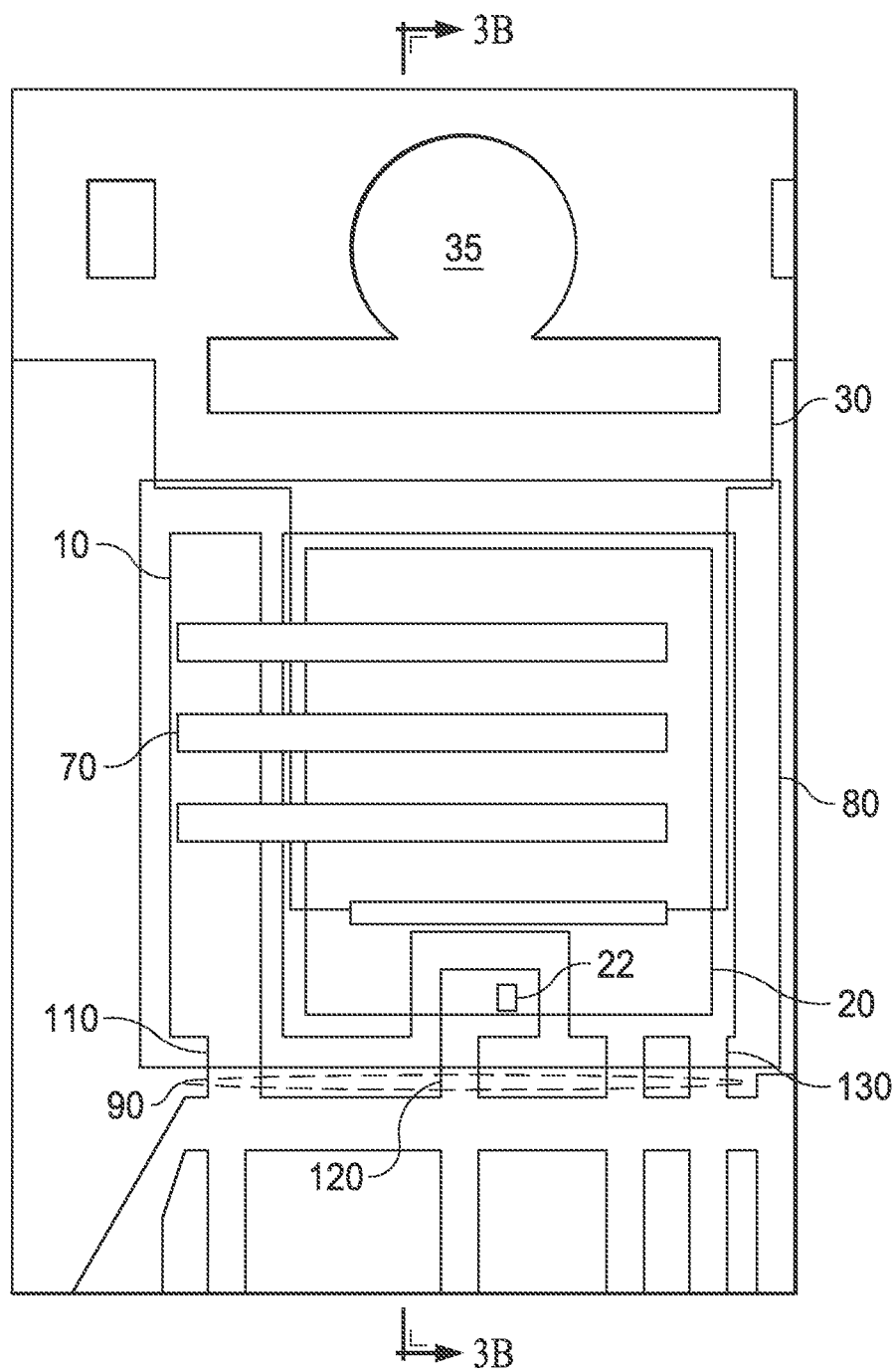
FIGS. 3A-3B, illustrates a semiconductor package having increased creepage distance in accordance with an embodiment of the present invention.
Figure 3B:
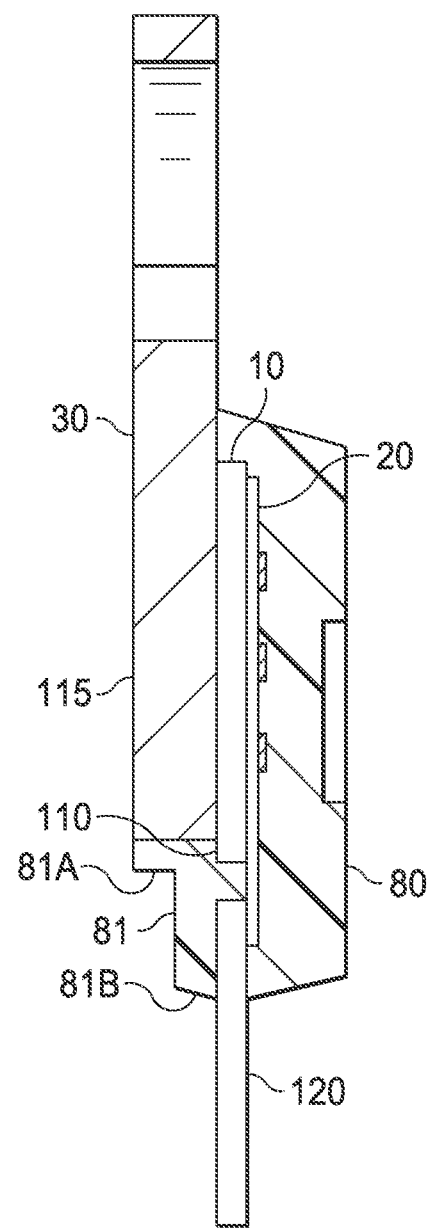

FIG. 3, which includes FIGS. 3A-3B, illustrates a semiconductor package having increased creepage distance in accordance with an embodiment of the present invention.

In this embodiment, the second lead frame 30 is prevented from shorting the second lead 120. The second lead frame 30 may have positioning errors that may short the various leads of the plurality of leads 90. For example, if the second lead frame 30 extends beyond the die paddle 105, the first lead 110 may short with the second lead 120 as well as the die paddle 105 may short with the second lead 120.

Referring to FIG. 3B, to avoid such shorting, in this embodiment, the design of the semiconductor package is changed so that only a thin section 81 of the encapsulant 80 supports the plurality of leads 90. Thus, the second lead frame 30 does not extend under the plurality of leads 90. Consequently, any such incorrect positioning of the second lead frame 30 is resolved during the molding process.

In various embodiments, the thickness of the thin section 81 is less than the thickness of the die attach 115 of the second lead frame 30. In one or more embodiments, the thickness of the thin section 81 is less than half the thickness of the die attach 115 of the second lead frame 30. In one or more embodiments, the thickness of the thin section 81 is about 0.1 to about 0.6 times the thickness of the die attach 115 of the second lead frame 30. As an illustration, in one embodiment, the thickness of the die attach 115 of the second lead frame 30 is about 1.27 mm while the thickness of the thin section 81 is less than 0.6 mm.

The thin section 81 is formed by a first sidewall 81A and a second sidewall 81B. The first sidewall 81A may be positioned between the die paddle 105 and the second lead 120 in one or more embodiments. In some embodiments, the first sidewall 81A may be positioned to overlap the die paddle 105 of the first lead frame 10.

Thus, in various embodiments, the use of the thin section 81 enables increasing the distance between the second lead 120 and the second lead frame 30 (creepage distance).

FIG. 4 illustrates a second lead frame having an aperture in accordance with an embodiment of the present invention.

As illustrated in FIG. 4, the second lead frame 30 includes an aperture 35, which may be used to mount an optional heatsink proximate the semiconductor package. The second lead frame 30 includes a die attach 115 configured to mount a semiconductor chip.

Figure 5A:
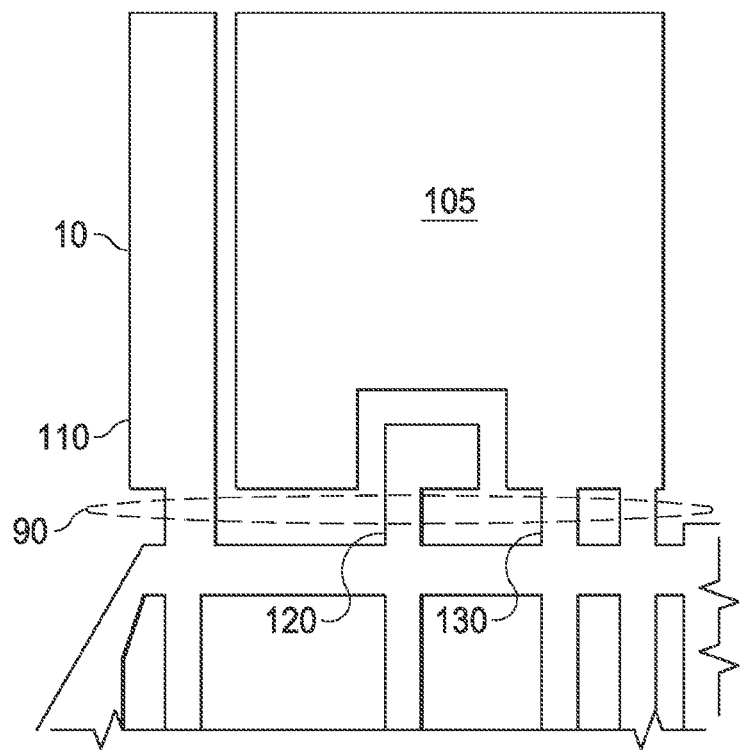
FIGS. 5A-5B, illustrates the first lead frame having a plurality of leads and the die paddle in accordance with embodiments of the present invention.
Figure 5B:
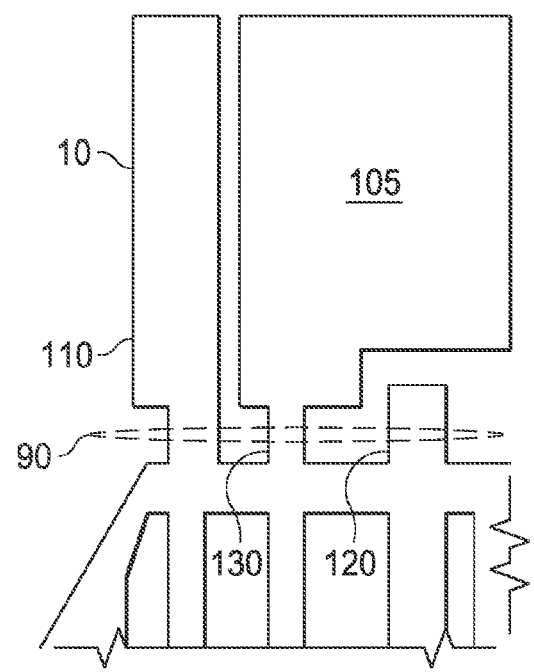

FIG. 5, which includes FIGS. 5A-5B, illustrates the first lead frame having a plurality of leads and the die paddle in accordance with embodiments of the present invention.

Referring to FIG. 5A, the first lead frame 10 includes a die paddle 105 and a plurality of leads 90. The plurality of leads 90 includes a first lead 110, which extends along the die paddle 105. The plurality of leads also includes a second lead 120 and the plurality of third leads 130. Some embodiments may have only a single third lead 130. The plurality of third leads 130 is electrically coupled to the die paddle 105. In contrast, the first lead 110 and the second lead 120 are isolated from the die paddle 105.

FIG. 5B illustrates an alternative embodiment of the first lead frame 10. Unlike the embodiment illustrated in FIG. 5A, in this embodiment, the die paddle 105 has an asymmetric shape. As a consequence, the second lead 120 is along the edge of the first lead frame 10 while the plurality of third leads or the third lead 130 is disposed between the first lead 110 and the second lead 120.

FIGS. 6-10 illustrate the semiconductor package during various stages of fabrication in accordance with embodiments of the present invention.

Figure 6:
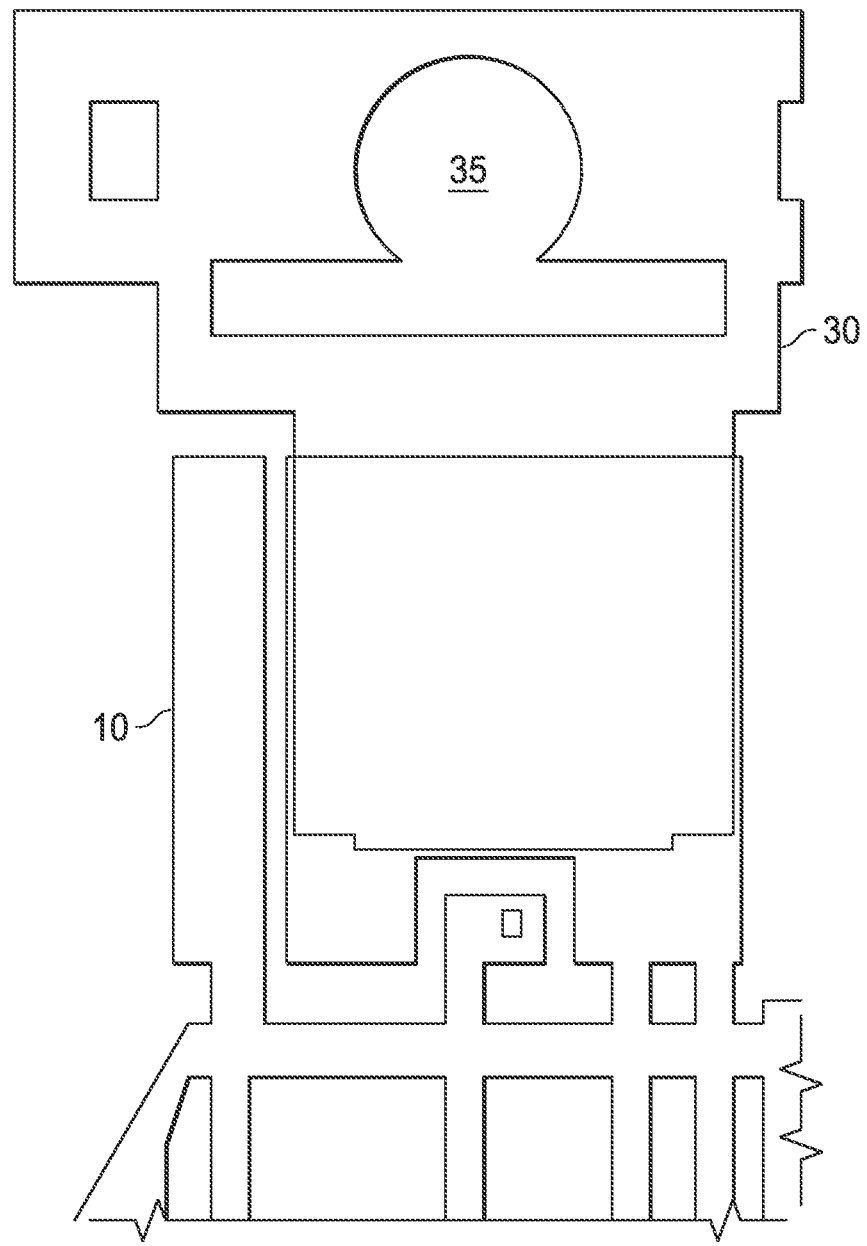
FIG. 6 illustrates a top view of the first and the second lead frames during fabrication of the semiconductor package in accordance with embodiments of the present invention.

FIG. 6 illustrates a top view of the first lead frame and the second lead frame during fabrication of the semiconductor package in accordance with embodiments of the present invention. Referring to FIG. 6, the first lead frame 10 is positioned over the second lead frame 30. In one or more embodiments, the die paddle 105 of the first lead frame 10 overlaps the die attach 115 of the second lead frame 30. In one or more embodiments, the die attach 115 of the second lead frame 30 partially overlaps the die paddle 105 of the first lead frame 10. The first lead frame 10 is mounted on to the second lead frame 30 using an adhesive which may be insulating or conductive. An insulating adhesive layer may be used to attach the first lead frame 10 with the second lead frame 30 in some embodiments so as to isolate the semiconductor chip 20 from the potential on the second lead frame 30.

Figure 7A:
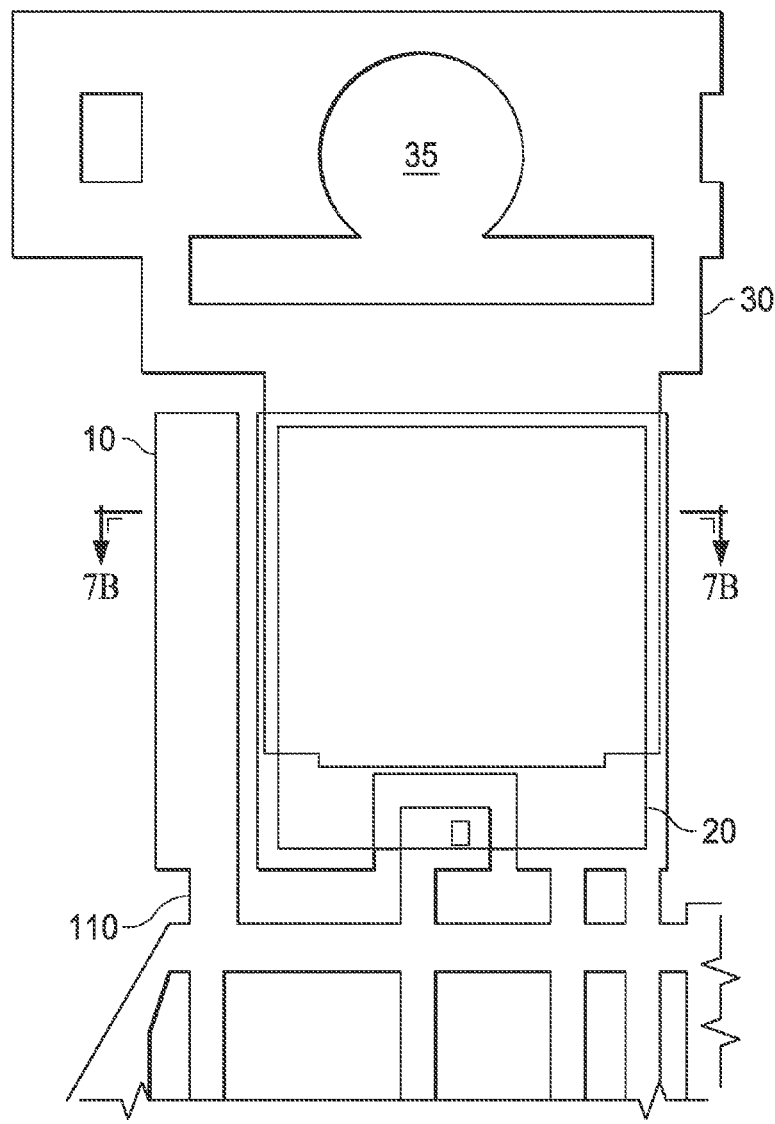
Figure 7B:
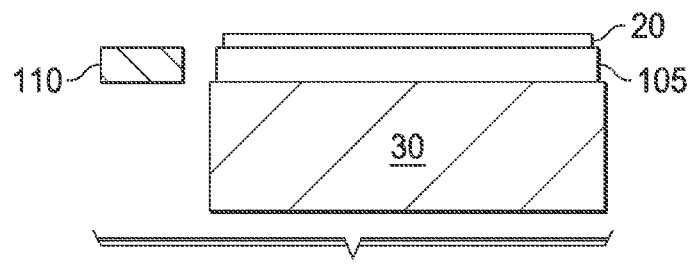

FIG. 7, which includes FIG. 7A-7B, illustrates the semiconductor package being fabricated after placing the semiconductor chip in accordance with an embodiment of the present invention, wherein FIG. 7A illustrates a top view, and wherein FIG. 7B illustrates a cross-sectional view.

As illustrated in FIGS. 7A and 7B, the semiconductor chip 20 is attached to the first lead frame 10. In one or more embodiments, the semiconductor chip 20 may be attached to the first lead frame 10 using an adhesive layer. The adhesive layer may be a conductive paste or a solder material in various embodiments.

In some embodiments, the semiconductor chip 20 may be attached to the first lead frame 10 before attaching the first lead frame 10 with the second lead frame 30. The semiconductor chip 20 is spaced away from the first lead 110 and therefore has to be interconnected in a separate process.

The semiconductor chip 20 may be formed using conventional processing, for example, within a wafer, which is diced to form a plurality of semiconductor chips comprising the semiconductor chip 20. As described above, the semiconductor chip 20 may be formed on a silicon substrate such as a bulk silicon substrate or a silicon on insulator (SOI) substrate. Alternatively, the semiconductor chip 20 may be a device formed on silicon carbide (SiC). Embodiments of the invention may also include devices formed on compound semiconductor substrates and may include devices on hetero-epitaxial substrates. In one embodiment, the semiconductor chip 20 is a device formed at least partially on gallium nitride (GaN), which may be a GaN on sapphire or silicon substrate.

In various embodiments, the semiconductor chip 20 may comprise a power chip, which, for example, draw large currents (e.g., greater than 30 amperes). In various embodiments, the semiconductor chip 20 may comprise discrete vertical devices such as a two or a three terminal power device. Examples of the semiconductor chip 20 include PIN or Schottky diodes, MISFET, JFET, BJT, IGBT, or thyristor.

In various embodiments, the semiconductor chip 20 may be a vertical semiconductor device configured to operate at about 20 V to about 1000 V. In one embodiment, the semiconductor chip 20 may be configured to operate at about 20 V to about 100 V. In another embodiment, the semiconductor chip 20 may be configured to operate at about 100 V to about 500 V. In yet another embodiment, the semiconductor chip 20 may be configured to operate at about 500 V to about 1000 V. In one embodiment, the semiconductor chip 20 may be an NPN transistor. In another embodiment, the semiconductor chip 20 may be a PNP transistor. In yet another embodiment, the semiconductor chip 20 may be an n-channel MISFET. In a further embodiment, the semiconductor chip 20 may be a p-channel MISFET. In one or more embodiments, the semiconductor chip 20 may comprise a plurality of devices such as a vertical MISFET and a diode, or alternatively two MISFET devices separated by an isolation region.

The thickness of the semiconductor chip 20 from the top surface to an opposite the bottom surface may be less than 50 μm in various embodiments. The thickness of the semiconductor chip 20 may be less than 20 μm in one or more embodiments. The thickness of the semiconductor chip 20 may be less than 10 μm in one or more embodiments.

Figure 8A:
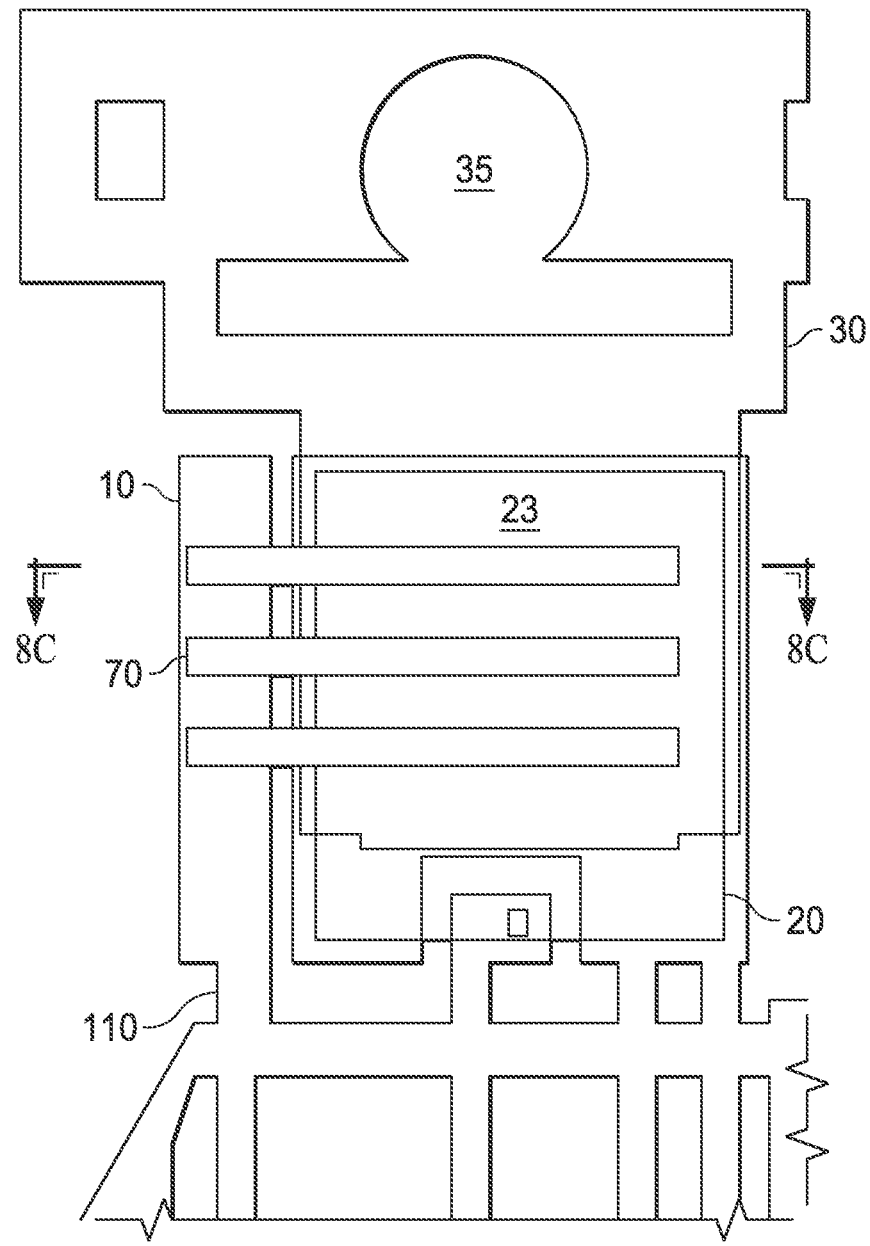
Figure 8B:
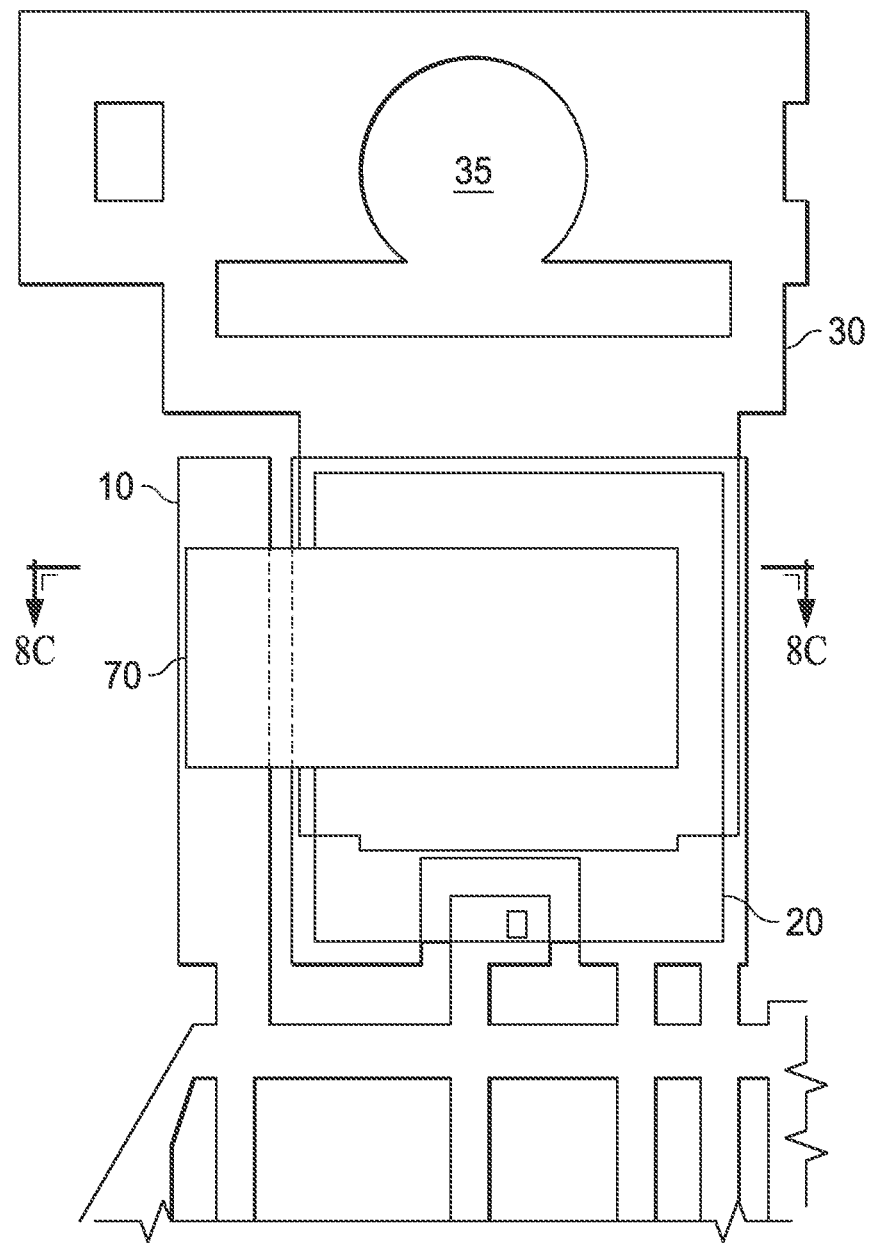
Figure 8C:
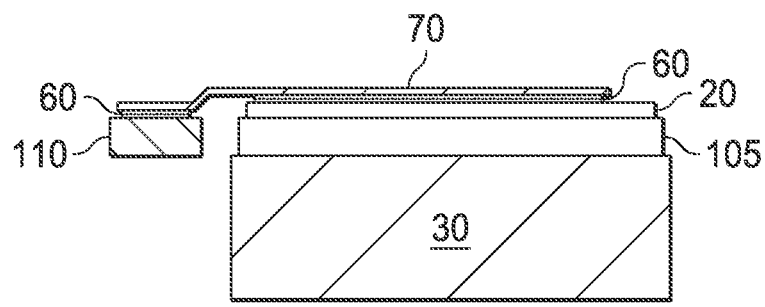
Figure 8D:
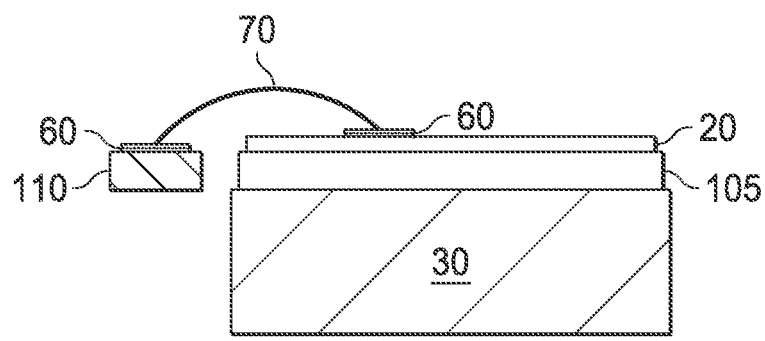

FIG. 8, which includes FIG. 8A-8D, illustrates the semiconductor package being fabricated after forming interconnects over the semiconductor chip in accordance with an embodiment of the present invention, wherein FIGS. 8A and 8B illustrate top views in alternative embodiments, and wherein FIGS. 8C and 8D illustrate cross-sectional views in alternative embodiments.

As illustrated in FIGS. 8A and 8C, a plurality of interconnects 70 is formed over the semiconductor chip 20. The plurality of interconnects 70 electrically couple a contact region on the top surface of the semiconductor chip 20 with the first lead 110. The plurality of interconnects 70 may comprise any type of interconnects such as wire bonds, clips, leads, strips, and others. In various embodiments, the plurality of interconnects 70 may be attached to the semiconductor chip 20 using a first adhesive layer 60. The first adhesive layer 60 may be a solder material in one embodiment. In another embodiment the first adhesive layer 60 may comprise a conductive paste such as a silver paste. Similarly, the plurality of interconnects 70 may be attached to the first lead 110 using a second adhesive layer 65. The second adhesive layer 65 may be a solder material and/or a conductive paste in various embodiments.

In one or more embodiments, as illustrated in FIG. 8B, the plurality of interconnects 70 may comprise a clip plate. The clip plate may be formed as a single plate in one embodiment.

In one or more embodiments, as illustrated in FIG. 8D, the plurality of interconnects 70 may comprise wire bonds, which may comprise aluminum or copper. The thickness of such aluminum wires may be about 10 μm to about 1000 μm in one or more embodiments. In another embodiment, the wire bonds 330 may comprise gold. The thickness of such gold wires may be about 10 μm to about 100 μm.

In various embodiments, ball bonding or wedge bonding may be used to attach the plurality of interconnects 70. In various embodiments, the plurality of interconnects 70 may be formed using thermosonic bonding, ultrasonic bonding, or thermo-compression bonding. Thermosonic bonding utilizes temperature, ultrasonic, and low impact force, and ball/wedge methods. Ultrasonic bonding utilizes ultrasonic and low impact force, and the wedge method only. Thermo-compression bonding utilizes temperature and high impact force, and the wedge method only.

For example, in one case, thermosonic bonding may be used with gold and copper wires. Two wire bonds are formed for each interconnection, one at contact region (e.g., third contact region 23) of the semiconductor chip 20 and another at a first lead 110 of the plurality of the leads 90. Bonding temperature, ultrasonic energy, and bond force and time may have to be closely controlled to form a reliable connection.

In one or more embodiments, a solder flux and a solder material may be deposited to form a first adhesive layer 60 and a second adhesive layer 65 for the interconnecting process. The solder material may be electroplated, although, in other embodiments, other processes such as electroless plating or deposition processes such as vapor deposition may also be used. The solder material may be a single layer or comprise multiple layers with different compositions. For example, in one embodiment, the solder material may comprises a lead (Pb) layer followed by a tin (Sn) layer. In another embodiment, a SnAg may be deposited as the solder material. Other examples include SnPbAg, SnPb, PbAg, PbIn, and lead free materials such as SnBi, SnAgCu, SnTn, and SiZn. In various embodiments, other suitable materials may be deposited.

A thermal treatment may be performed to form the first adhesive layer 60 and the second adhesive layer 65 illustrated in FIGS. 8C-8D. For example, in the embodiment when Pb/Sb layer is deposited, after reflow, high lead alloys including 95 Pb/5 Sn (95/5) or 90 Pb/10 Sn (95/10) with melting temperatures in excess of 300° C. are formed. In a different embodiment, eutectic 63 Pb/37 Sn (63/37) with a melting temperature of 183° C. is formed. Similarly, in some embodiments, lead free adhesive layers may be formed having a composition of 97.5 Sn/2.6 Ag (97.5/2.5).

Figure 9A:
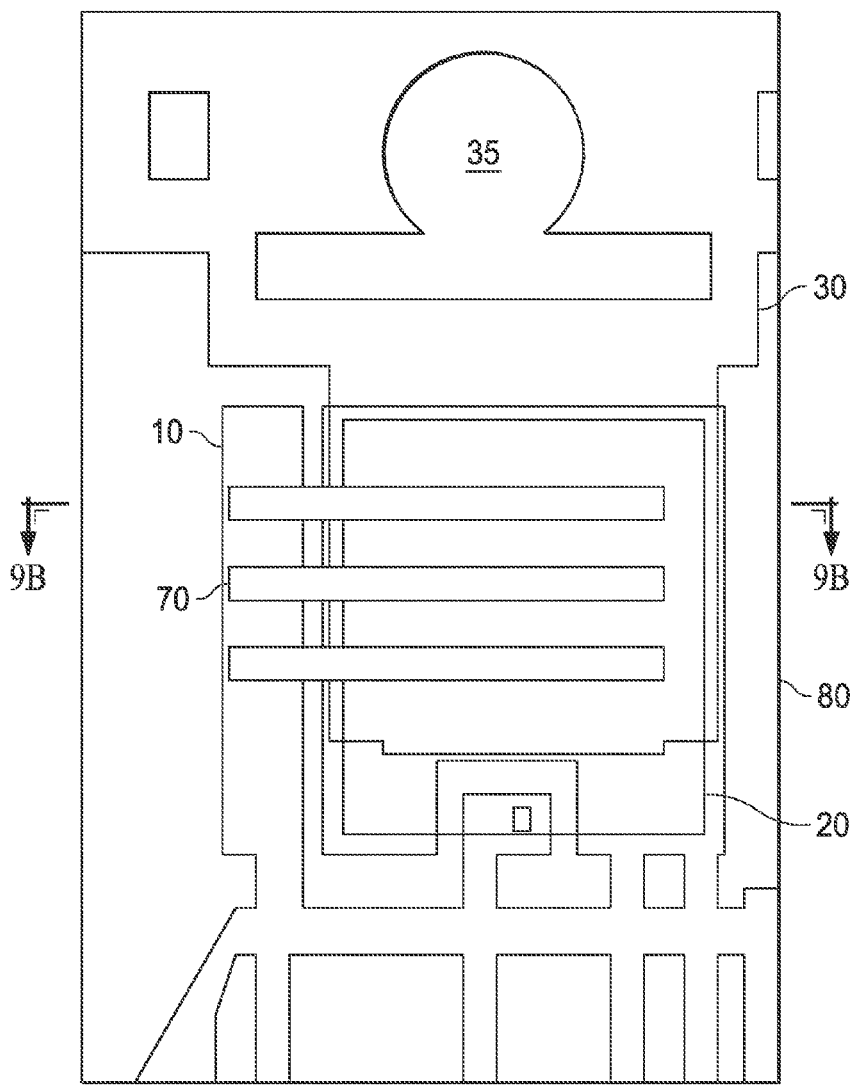
Figure 9B:
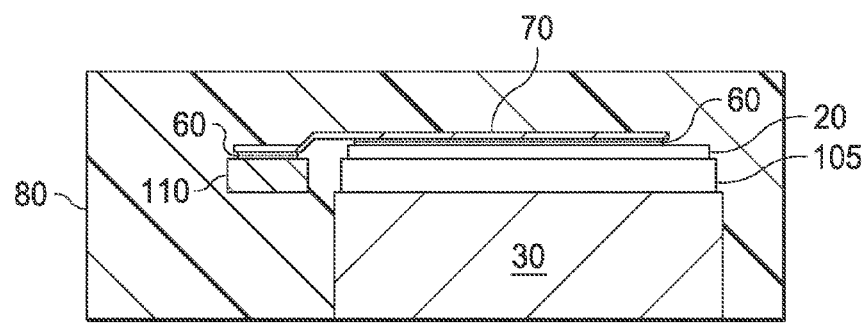

FIG. 9, which includes FIGS. 9A-9B, illustrates a semiconductor package being fabricated after encapsulation in accordance with an embodiment of the present invention, wherein FIG. 9A illustrates a top view, and wherein FIG. 9B illustrates a cross-sectional view.

As illustrated in FIGS. 9A and 9B, an encapsulant 80 is formed over the first lead frame 10, the second lead frame 30, the semiconductor chip 20, and the plurality of interconnects 70. The encapsulant 80 is applied over the semiconductor chip 20 and at least partially encloses the semiconductor chip 20. In one or more embodiments, the encapsulant 80 is applied using a molding process such as compression molding, transfer molding process, injection molding, granulate molding, powder molding, liquid molding, as well as printing processes such as stencil or screen printing.

In various embodiments, the encapsulant 80 comprises a dielectric material and may comprise a mold compound in one embodiment. In other embodiments, the encapsulant 80 may comprise one or more of a polymer, a copolymer, a biopolymer, a fiber impregnated polymer (e.g., carbon or glass fibers in a resin), a particle filled polymer, and other organic materials. In one or more embodiments, the encapsulant 80 comprises a sealant not formed using a mold compound, and materials such as epoxy resins and/or silicones. In various embodiments, the encapsulant 80 may be made of any appropriate duroplastic, thermoplastic, a thermosetting material, or a laminate. The material of the encapsulant 80 may include filler materials in some embodiments. In one embodiment, the encapsulant 80 may comprise epoxy material and a fill material comprising small particles of glass or other electrically insulating mineral filler materials like alumina or organic fill materials.

The encapsulant 80 may be cured, i.e., subjected to a thermal process to harden thus forming a hermetic seal protecting the semiconductor chip 20. The curing process hardens the encapsulant 80 thereby forming a single substrate holding the first lead frame 10, the second lead frame 30, and the semiconductor chip 20.

Figure 10:
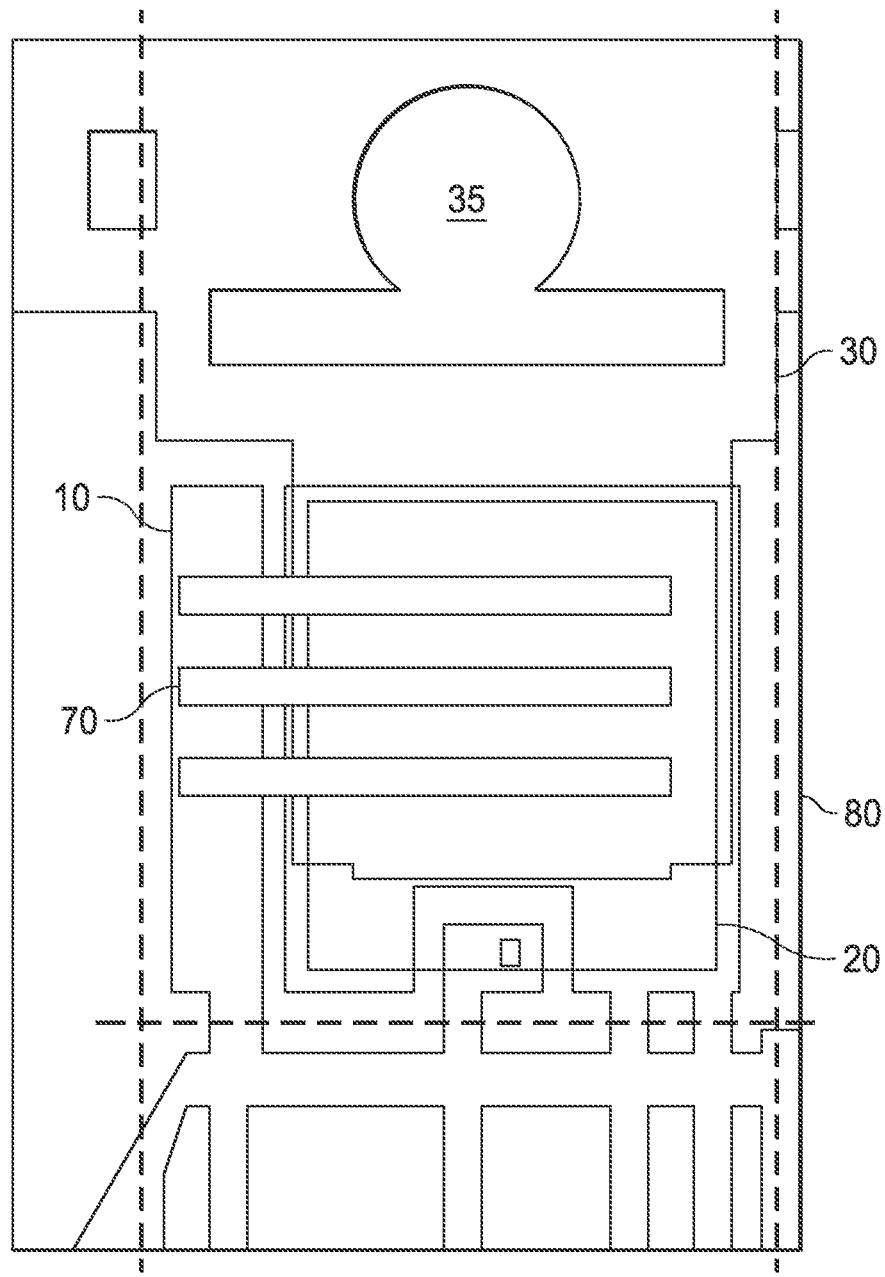
FIG. 10 illustrates a top view of the semiconductor package during singulation in accordance with an embodiment of the present invention.

FIG. 10 illustrates a top view of the semiconductor package during singulation in accordance with an embodiment of the present invention.

The singulation process may be performed to separate adjacent lead frames if a batch process was used in the formation of the semiconductor package. For example, in case of a batch process, adjacent the semiconductor packages may be connected by the first lead frame 10 and the second lead frame 30. During singulation, the first lead frame 10 and the second lead frame 30 are separated, e.g., using a saw process or a punching process, to form individual semiconductor packages. The dashed lines in FIG. 10 illustrate a possible direction of the sawing blade during singulation. The singulation process may separate the first lead 110 from the second lead 120, and similarly the second lead 120 from the third lead 130.

Subsequent processing may be performed as in conventional processing. For example, plating of the exposed plurality of leads 90 may be performed to improve the subsequent soldering process.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-10 may be combined with each other in various embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor package comprising:
a first lead frame;
a second lead frame, wherein the first lead frame is disposed over the second lead frame, and wherein the first lead frame comprises a die paddle and a plurality of leads; and
a semiconductor chip disposed over the first lead frame, the semiconductor chip coupled to the plurality of leads, wherein the first lead frame is disposed between the semiconductor chip and the second lead frame, wherein the die paddle and at least one lead of the plurality of leads overlaps with and mechanically supports a major surface of the semiconductor chip, wherein the semiconductor chip comprises a transistor comprising a source region, a gate region, and a drain region, wherein the first lead frame comprises a die paddle coupled to the source region, and wherein the plurality of leads comprise a source lead coupled to the die paddle, a drain lead coupled to the drain region, and a gate lead coupled to the gate region.

2. The package of claim 1, wherein the semiconductor chip comprises a first contact region on a first side, a second contact region on the first side, and a third contact region on a second side, the second side being opposite to the first side.

3. The package of claim 2, wherein the first side of the semiconductor chip faces the first lead frame.

4. The package of claim 1, wherein the second lead frame is thicker than the first lead frame.

5. The package of claim 1, wherein the semiconductor chip comprises a vertical power semiconductor chip.

6. The package of claim 1, wherein the semiconductor chip is electrically isolated from the second lead frame.

7. The package of claim 1, wherein the transistor comprises a vertical transistor having the source region on a first side, the gate region on the first side, and the drain region on a second side, wherein the second side is opposite to the first side.

8. The package of claim 1, further comprising an encapsulant disposed at the first lead frame, the second lead frame, and the semiconductor chip, wherein the encapsulant has a thin section disposed at the plurality of leads.

9. A semiconductor package comprising:
a first lead frame comprising a first die paddle and a plurality of leads;
a second lead frame having a second die paddle, wherein the first die paddle is disposed over the second die paddle; and
a semiconductor chip disposed over the first die paddle, the semiconductor chip having a plurality of contact regions on a first side facing the first lead frame, the plurality of contact regions being coupled to the plurality of leads, wherein the first lead frame is disposed between the semiconductor chip and the second lead frame, wherein the first die paddle and at least one lead of the plurality of leads overlaps with and mechanically supports a major surface of the semiconductor chip, wherein the semiconductor chip comprises a transistor comprising a source region, a gate region, and a drain region, wherein the first die paddle is coupled to the source region, and wherein the plurality of leads comprise a source lead coupled to the second die paddle, a drain lead coupled to the drain region, and a gate lead coupled to the gate region.

10. The package of claim 9, wherein the semiconductor chip has a second side opposite the first side, wherein the second side comprises a contact region, wherein the contact region on the second side is coupled to a lead of the plurality of leads.

11. The package of claim 9, further comprising an encapsulant disposed at the first lead frame, the second lead frame, and the semiconductor chip.

12. The package of claim 11, wherein the encapsulant has a thin section disposed at the plurality of leads.

13. The package of claim 12, wherein the encapsulant has a first sidewall and a second sidewall so as to form the thin section, and wherein the first sidewall is positioned between the first die paddle and the plurality of leads.

14. The package of claim 12, wherein the encapsulant has a first sidewall and a second sidewall so as to form the thin section, and wherein the first sidewall is positioned between the second die paddle and the plurality of leads.

15. The package of claim 12, wherein the thin section has a first thickness, wherein the second die paddle has a second thickness, and wherein the first thickness is about 10% to about 60% of the second thickness.

16. The package of claim 12, wherein the transistor comprises a vertical transistor, the plurality of contact regions comprising the source region on the first side and the gate region on the first side, wherein the vertical transistor comprises the drain region on a second side, and wherein the second side is opposite to the first side.

17. The package of claim 12, wherein a major surface of the semiconductor chip is supported by the first die paddle and at least one lead of the plurality of leads.

18. A semiconductor package comprising:
   a first lead frame comprising a first die paddle and a plurality of leads;
   a second lead frame having a second die paddle, the first die paddle disposed over the second die paddle;
   a semiconductor chip disposed over the first die paddle, the semiconductor chip having a plurality of contact regions on a first side facing the first lead frame, the plurality of contact regions being coupled to the plurality of leads, wherein the first lead frame is disposed between the semiconductor chip and the second lead frame, wherein the semiconductor chip has a second side opposite the first side, wherein the second side comprises a contact region, wherein the contact region on the second side is coupled to a lead of the plurality of leads of the first lead frame, and wherein the first die paddle and at least one lead of the plurality of leads overlaps with and mechanically supports a major surface of the semiconductor chip, wherein the semiconductor chip comprises a vertical transistor comprising a source region and a gate region on the first side, and a drain region on the second side, wherein the first die paddle is coupled to the source region, and wherein the plurality of leads comprise a source lead coupled to the second die paddle, a drain lead coupled to the drain region, and a gate lead coupled to the gate region; and
   an encapsulant disposed at the first lead frame, the second lead frame, and the semiconductor chip.

19. The package of claim 18, wherein a first thickness of the encapsulant at the plurality of leads is less than a second thickness of the encapsulant at the first die paddle, wherein the first thickness and the second thickness are measured in a direction perpendicular to the first side of the semiconductor chip.

20. The package of claim 19, wherein the change in thickness from the first thickness to the second thickness occurs at an intermediate sidewall disposed vertically, wherein the intermediate sidewall is disposed between the plurality of leads and the second die paddle.

* * * * *